United States Patent
Wu et al.

(10) Patent No.: US 10,848,116 B2
(45) Date of Patent: Nov. 24, 2020

(54) BI-DIRECTIONAL VARIABLE GAIN ACTIVE COMBINER AND SPLITTER

(71) Applicant: Tubis Technology Inc., Pasadena, CA (US)

(72) Inventors: Kenny Kun-Long Wu, Pasadena, CA (US); James June-Ming Wang, Pasadena, CA (US)

(73) Assignee: Tubis Technology INC., Pasadena, CA (US)

( * ) Notice: Subject to any disclaimer, the term of this patent is extended or adjusted under 35 U.S.C. 154(b) by 0 days.

(21) Appl. No.: 16/711,215

(22) Filed: Dec. 11, 2019

(65) Prior Publication Data

US 2020/0228081 A1 Jul. 16, 2020

Related U.S. Application Data

(60) Provisional application No. 62/777,870, filed on Dec. 11, 2018.

(51) Int. Cl.
| | |
|---|---|
| H03F 3/19 | (2006.01) |
| H03G 3/30 | (2006.01) |
| H04B 7/06 | (2006.01) |
| H03G 1/00 | (2006.01) |
| H03F 3/72 | (2006.01) |

(52) U.S. Cl.
CPC ............. *H03G 3/3042* (2013.01); *H03F 3/19* (2013.01); *H03F 3/72* (2013.01); *H03G 1/0088* (2013.01); *H04B 7/0617* (2013.01); *H03F 2200/318* (2013.01); *H03F 2200/451* (2013.01)

(58) Field of Classification Search
CPC ... H01L 2223/6655; H03F 3/195; H03F 3/19; H03F 3/72; H03F 2200/423; H03F 2200/318; H03F 2200/451; H03F 3/62; H03G 3/3042; H03G 1/0088; H04B 7/0617
See application file for complete search history.

(56) References Cited

U.S. PATENT DOCUMENTS

2020/0091605 A1 * 3/2020 Ngai .................... H04B 7/0404

* cited by examiner

*Primary Examiner* — Rahel Guarino
(74) *Attorney, Agent, or Firm* — Imperium Patent Works; Zheng Jin

(57) ABSTRACT

A bi-directional active combiner and splitter using bi-directional variable gain amplifiers (BD_VGAs) is proposed. Advantages of the proposed bi-directional active combiner and splitter includes the following 1) compact size—for each BD_VGA, cascode transistor pair is small and the same matching network is used by the cascode transistor pair for both directions; 2) high efficiency—no switching loss in signal path, only switched matching; 3) reduced passive trace loss and power consumption—simplified signal interconnection; 4) active current combining—eliminates large size in the passive combiner; 5) high input-output isolation—cascode and neutralization; 6) precise gain control and unequal combining or splitting—changing the gain of the BD_VGA; and 7) phase-invariant amplifier design.

25 Claims, 9 Drawing Sheets

Bi-Directiona Variable Gain Amplifier (BD_VGA)
+ Active Combiner and Splitter

Bi-Directiona Variable Gain Amplifier (BD_VGA)

FIG. 1

Cascode Amplifier with Neutralization

FIG. 2

Cascode Bi-Directional Amplifier

8-1 Bi-directional Active Combiner and Splitter
For TDD Phased-Array Antenna

BI-DIRECTIONAL VARIABLE GAIN ACTIVE COMBINER AND SPLITTER

CROSS REFERENCE TO RELATED APPLICATIONS

This application claims priority under 35 U.S.C. § 119 from U.S. Provisional Application No. 62/777,870, entitled "Bi-Directional Variable Gain Active Combiner and Splitter," filed on Dec. 11, 2018, the subject matter of which is incorporated herein by reference.

TECHNICAL FIELD

The disclosed embodiments relate generally to wireless network communications, and, more particularly, to Bi-directional variable gain active combiner and splitter in phased array antenna.

BACKGROUND

The bandwidth shortage increasingly experienced by mobile carriers has motivated the exploration of the under-utilized Millimeter Wave (mmWave) frequency spectrum around 24 G and 300 G Hz for the next generation 5G broadband cellular communication networks. The available spectrum of mmWave band is hundreds of times greater than the conventional cellular system. The mmWave wireless network uses directional communications with narrow beams and can support multi-gigabit data rate. The under-utilized bandwidth of the mmWave spectrum has wavelengths ranging from 1 mm to 100 mm. The very small wavelengths of the mmWave spectrum enable large number of miniaturized antennas to be placed in a small area. Such miniaturized antenna system can produce high beamforming gains through electrically steerable arrays generating directional transmissions.

In antenna theory, a phased antenna array usually means an array of antennas that creates a beam of radio waves can be electronically steered to point in different directions, without moving the antennas. In the phased antenna array, the radio frequency current from the transmitter is fed to the individual antennas with the correct phase relationship so that the radio waves from the separate antennas add together to increase the radiation in a desired direction, while cancelling to suppress radiation in undesired directions. In the phased antenna array, the power from the transmitter is fed to the antennas through phase shifters, controlled by a processor, which can alter the phase electronically, thus steering the beam of radio waves to a different direction.

A receive phased-array antenna includes a combiner network, which is formed by multiple combiners. Similarly, a transmit phased-array antenna includes a divider network, which is formed by multiple dividers. A passive divider network is structurally the same as a combiner network. Time-Division Duplexing (TDD) Phased-Array Antenna includes a bi-directional amplifier and a bidirectional combiner and splitter. Conventional realization of a bi-directional amplifier uses an input/output switch and two amplifiers. Efficient implementation of the bi-directional amplifier without the input/output switch is feasible but it suffers several design constraints in matching network which limits the gain and the output power of the bi-directional amplifier. Conventional passive combiner and splitter implementation are Wilkinson or Rat Race or others. Such implementation suffers from large area, loss, and limited bandwidth. Conventional active combiner and splitter typically require input and output switches, which suffers from large area and switch loss. In addition, an active combiner can use current combining from the drain of cascode amplifiers and share an output matching network (OMN), but this implementation is hard to realize when the n:1 combiner has a high n value, which have n parallel parasitic. This is due to long traces connecting the cascode outputs and the OMN adds additional parasitic. The parasitic in those long traces affects the current combining. An alternate approach is to use long transmission line to bring the signals to be combined to input of the cascode amplifiers and keeps the output traces to the OMN short. This approach is more feasible since the multiple connected outputs from amplifier transistors already have more parasitic comparing to the input matching network of the cascode amplifiers.

In a Multi-Beam Transmitter Phased-Array antenna, there are multiple beamformers, one for each beam. The active combiner can be used at the output of multiple beamformers. Conversely, for a multi-beam Receiver Phased-Array antenna, the active splitter can be used at the output of the antenna to split the received signal for multiple beamformers. In a multi-beam TDD phased-array, the active beamformer/splitter can be used between the antenna elements and the multiple TDD beamformers. A solution is sought to implement a bi-directional variable gain amplifier which can be used in the active combiner and splitter for the multi-beam TDD phased-array antenna in beamforming networks.

SUMMARY

A bi-directional active combiner and splitter using bi-directional variable gain amplifiers (BD_VGAs) is proposed. Advantages of the proposed bi-directional active combiner and splitter includes the following 1) compact size—for each BD_VGA, cascode transistor pair is small and the same matching network is used by the cascode transistor pair for both directions; 2) high efficiency—no switching loss in signal path, only switched matching; 3) reduced passive trace loss and power consumption—simplified signal interconnection; 4) active current combining—eliminates large size in the passive combiner; 5) high input-output isolation—cascode and neutralization; 6) precise gain control and unequal combining or splitting—changing the gain of the BD_VGA; and 7) phase-invariant amplifier design.

Other embodiments and advantages are described in the detailed description below. This summary does not purport to define the invention. The invention is defined by the claims.

DETAILED DESCRIPTION

Reference will now be made in detail to some embodiments of the invention, examples of which are illustrated in the accompanying drawings.

Figure 1:
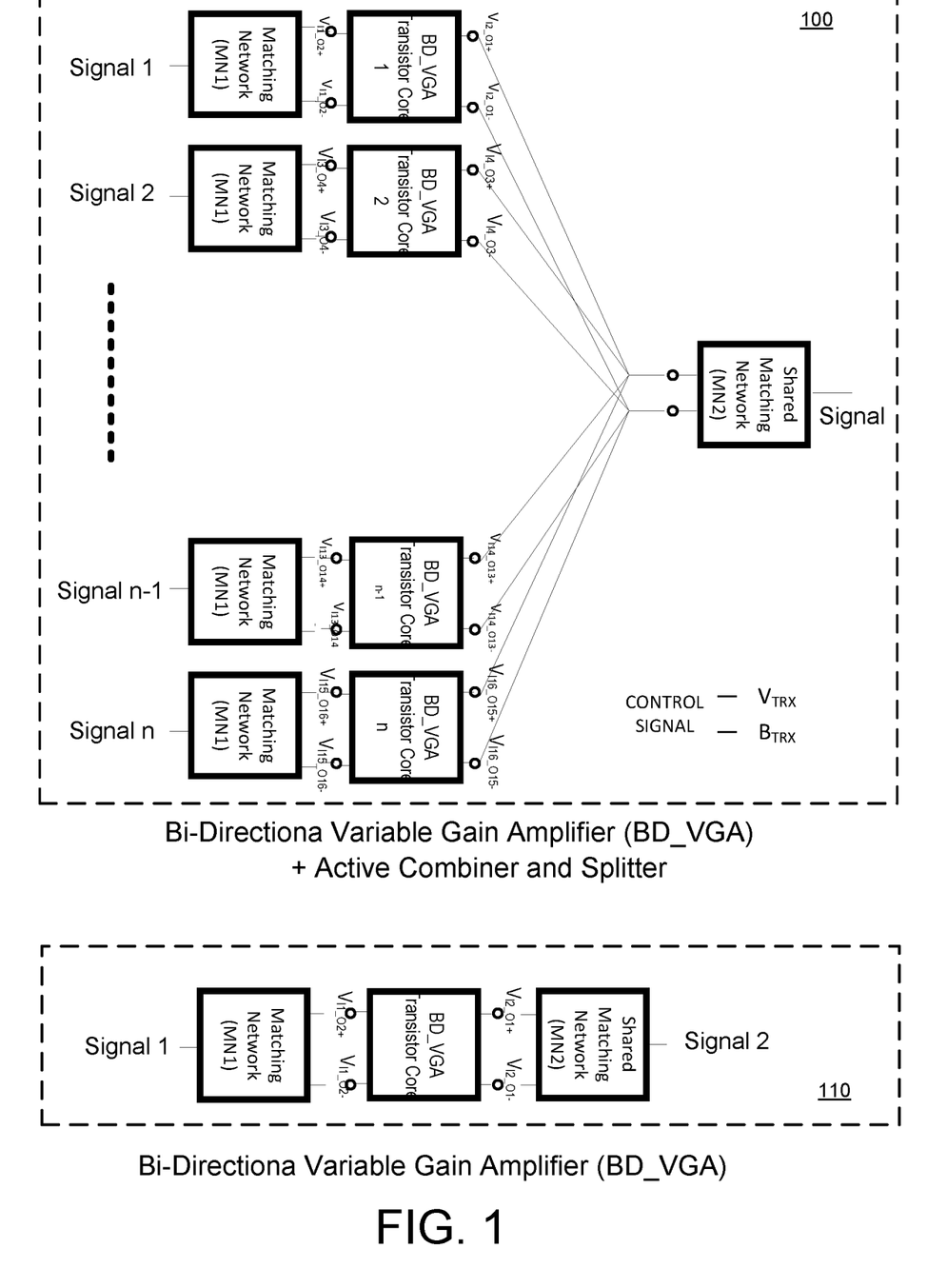
FIG. 1 is a simplified block diagram of a bi-directional active combiner and splitter in accordance with one novel aspect.

FIG. 1 is a simplified block diagram of a bi-directional active combiner and splitter 100 in accordance with one novel aspect. In general, a bi-directional active combiner and splitter has n paths to perform signal summation and division for either transmitter or receiver purpose. The number of n depends on system requirement. In the example of FIG. 1, The bi-directional active combiner and splitter 100 comprises n matching network 1 (MN1) coupled to input/output signals/terminals, n bi-directional variable gain transistor cores (Transistor Core) 1 to Transistor Core n), and one shared matching network 2 (MN2) coupled to input/output signal/terminal. The bi-directional Transistor Cores are high isolation variable gain amplifiers having the same structure. A control signal ($V_{TRX}$) is used to select either transmitter or receiver mode signal flow direction and another control signal ($B_{TRX}$) is used to assign gain level for each high isolation variable gain amplifier. In a preferred embodiment, the receive direction, input signals enter through MN1 (act as input matching networks), amplified by the Transistor cores, and combined to an output signal through MN2 (act as output matching network). In the transmit direction, input signal is received through MN2 (act as input matching network), divided and then amplified by the Transistor Cores, and then transmitted out as output signals through MN1 (act as output matching networks). In another preferred embodiment, the reverse direction for transmit and receive signal flow can be used.

Conventional realization of a bi-directional amplifier uses an input/output switch and two uni-directional amplifiers. Efficient implementation of the bi-directional amplifier without the input/output switch is feasible but it still suffers several design constraints in matching network which limits the gain and the output power of the bi-directional amplifier. Conventional passive combiner and splitter implementation are Wilkinson or Rat Race or others. Such implementation suffers from large area, loss, and limited bandwidth. On the other hand, conventional active combiner and splitter typically requires input and output switches, which suffers from large area and switch loss.

In accordance with one novel aspect, a novel bi-directional variable gain amplifier (BD_VGA) 110 is proposed, which can be modified and used in the active combiner and splitter 100. BD_VGA 110 consists of a Transistor Core and two matching networks (MN1 and MN2) at opposite sides of the Transistor Core. In the proposed BD_VGA design, the Transistor Core contains complementary pairs of cascode differential transistors to provide the bi-directionality and gain adjustment function as configured by the control signals. In the preferred embodiment of BD_VGA, the two matching networks (MN1 and MN2) connected to the opposite sides of the Transistor Core are identical which requires the Transistor Core to have the identical impedance in either amplifier direction. In an alternative embodiment, the Transistor Cores have different impedances for different amplifier directions. Accordingly, the matching network MN1 should incorporate the switched passive elements to present the (conjugate) matching impedance based on the amplifier direction and the matching network MN2 should incorporate switched passive elements to present the (conjugate) matching impedance to the Transistor Core based on the amplifier direction. Note that both embodiments are applicable to the invention. Modify the BD_VGA for the bi-directional active combiner and splitter 100, multiple set of MN's and Transistor Cores, in which each MN1 is connected to the left nodes of the Transistor core similar to that in the BD_VGA, while the right nodes of the Transistor cores are connected together to a common node (current combining or voltage sharing) first and then connects to a shared MN2. Note that in the bi-directional active combiner and splitter 100, the MN1 and MN2 are different because the MN2 is now the matching network for the connected nodes (common nodes) of the multiple Transistor Cores.

The bi-directional active combiner and splitter 100 applies current combining and voltage sharing, and merge the multiple novel BD_VGAs into a single device which is compact in size, has high efficiency (no switch loss), and simplifies signal interconnection. The output current combining or input voltage sharing mechanism may be realized by two ways. First, a cascode amplifier is used in each BD_VGA to achieve high output impedance and input to output isolation. Second, an output matching network (e.g., MN2, preferred to be a differential transformer coil), is placed at the right node to transform impedance, also used as a matching component and the amplifier load. Using the switch matching in the Transistor Core, which will be described later with respect to FIG. 3, the condition for achieving reactance match of active combining or splitting is met where the (input) left node reactance of each of the Transistor Core maintains the same in both signal flow directions, and the (output) right node reactance of each of the Transistor Cores maintains the same in both signal flow directions, implying the right node reactance of the overall connected right nodes of Transistor Cores maintains the same in both signal flow directions.

Figure 2:
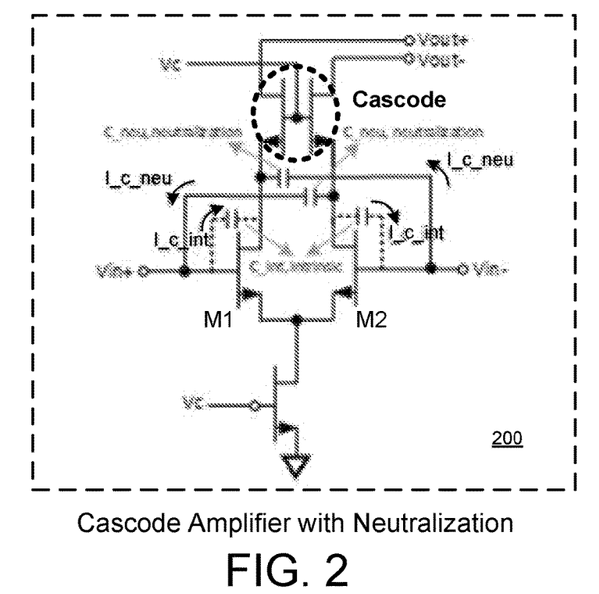
FIG. 2 is a simplified circuit diagram of a cascode amplifier with neutralization.

FIG. 2 is a simplified circuit diagram of a (uni-directional) cascode amplifier 200 with neutralization. Cascode amplifier 200 comprises a pair of transistors M1 and M2, and a pair of cascode transistors to provide higher isolation between input and output. Vin+ and Vin− connected to input matching network (IMN) to achieve low input return loss (good matching, e.g., to 50 ohm). Vout+ and Vout− connected to output matching network (OMN) to achieve low output return loss (good matching, e.g., to 50 ohm). Note that the capacitive coupling from transistor gate to drain of M1 and M2 is shown as dashed line and a parasitic capacitor I_c_int). Accordingly, capacitors (I_c_neu) are added to provide negative capacitive feed from Vin+ or Vin− to cancel out the signal capacitive coupling. This is also referred to as neutralization. The negative feed capacitance (C_neu) should be equal to parasitic capacitance (C_int) between gate and drain of M1 and M2 to achieve good cancellation. In other words, |I_C_neu| will be equal to

|I_C_int|. The current Vin+→I_c_neu→ drain of M2 cancels out the current Vin−→I_c_int→ drain of M2 and Vin−→I_c_neu-> drain of M1 cancels out Vin+→I_c_int→ drain of M1). As a result, by way of neutralization, high isolation between inputs and outputs can be achieved, which is important for bi-directional amplifier design. Note that the lowest transistor is connected to the virtual ground of the differential transistor pair to act as a bias current switch.

Figure 3:
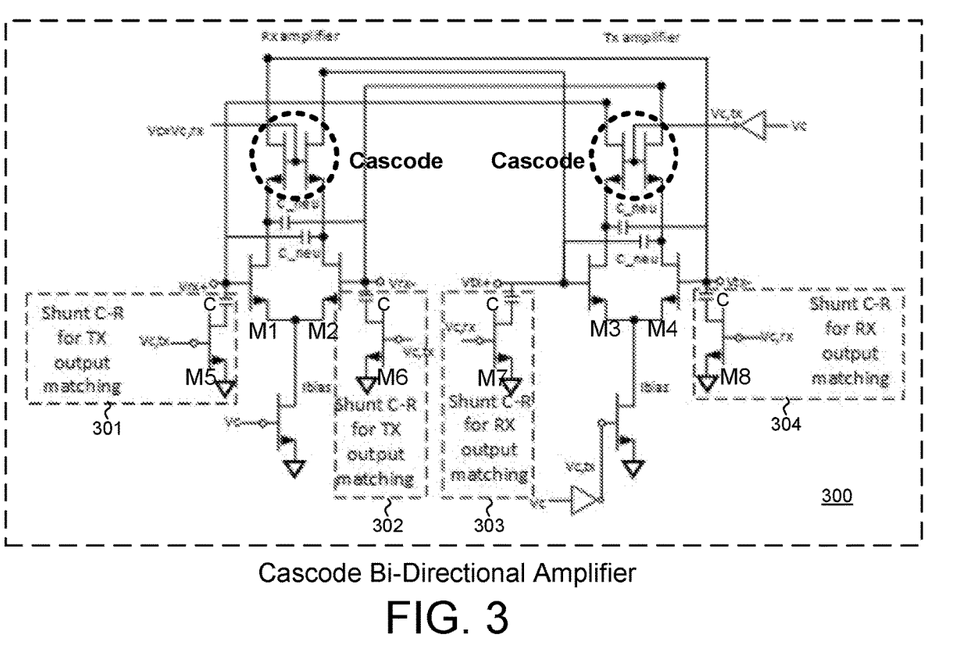
FIG. 3 is a simplified circuit diagram of a cascode bi-directional amplifier with switched matching and neutralization.

FIG. 3 is a simplified circuit diagram of a cascode bi-directional amplifier 300 with switched matching and neutralization. Bi-directional amplifier 300 comprises two complementary uni-directional cascode amplifiers, e.g., one for RX direction and one for TX direction, each cascode amplifier is similar to cascode amplifier 200 in FIG. 2. RX cascode amplifier comprises differential transistor pair (M1-M2), and TX cascode amplifier comprises a complementary differential transistor pair (M3-M4) for the bi-directional amplifier. The input of the first directional differential pair (e.g., inputs of M1-M2) is connected to the output of the second (complementary) directional differential pair (e.g., outputs of M3-M4). The output of the first directional differential pair (e.g., outputs of M1-M2) is connected to the input of the second directional differential pair (e.g., inputs of M3-M4). Only one of the two differential pairs are turned on at a time, which is controlled by a digital control signal Vc. The control signal for RX amplifier Vc,rx is the same as control signal Vc, the control signal for TX amplifier Vc,tx is the inverse of control signal Vc.

In the preferred embodiment, the input and output reactance of the bi-directional amplifier 300 is designed to be equal to each other to achieve simultaneous TX and RX output matching. However, the output capacitance at the cascode transistor of M1-M2 or M3-M4 is generally smaller than the input capacitance at the transistor gate. To compensate for this and to realize output matching, match loads 301-304 are introduced—each match load comprises a capacitor C and a transistor (e.g., M5-M8), which act as a transistor switch. The match load is for providing a shunt parasitic (equivalent series C-R) to ground for improving the output matching (e.g., to increase the output capacitance), where the parasitic R is from the transistor switch and is very small, thus impedance is dominated by C. When M1-M2 are turned on, M5-M6 are turned off (controlled by Vc,tx), while M7-M8 are turned on (controlled by Vc,rx). When M3-M4 are turned on, M5-M6 are turned on (controlled by Vc,tx), while M7-M8 are turned off (controlled by Vc,rx). When M5-M6 or M7-M8 are off, the shunt series C-transistor to ground has high impedance and having negligible effects on matching. When M5-M6 or M7-M8 are on, the capacitance of C is added to the output capacitance to realize output matching. As a result, a high isolation bi-directional amp transistor pairs, with near identical input and output reactance is realized. Additionally, the reactance at Vtx+ and Vtx− nodes is near identical regardless of the direction of the signal flow (either M1-M2 or M3-M4 is turned on) and the reactance at Vrx+ and Vrx− nodes is near identical regardless of the direction of the signal flow (either M1-M2 or M3-M4 is turned on). In an alternative embodiment, the Transistor Core does not include the switch match load, thus, would have different impedance for different amplifier directions, and the switched match loads are incorporated into the MN1 and MN2, using similar circuit element such as shunt series C-R where R is from the switch transistor. The switch match load allows MN1 and MN2 to have different impedances depending on the direction of the amplifier, to (conjugate) match to the Transistor Core.

Figure 4:
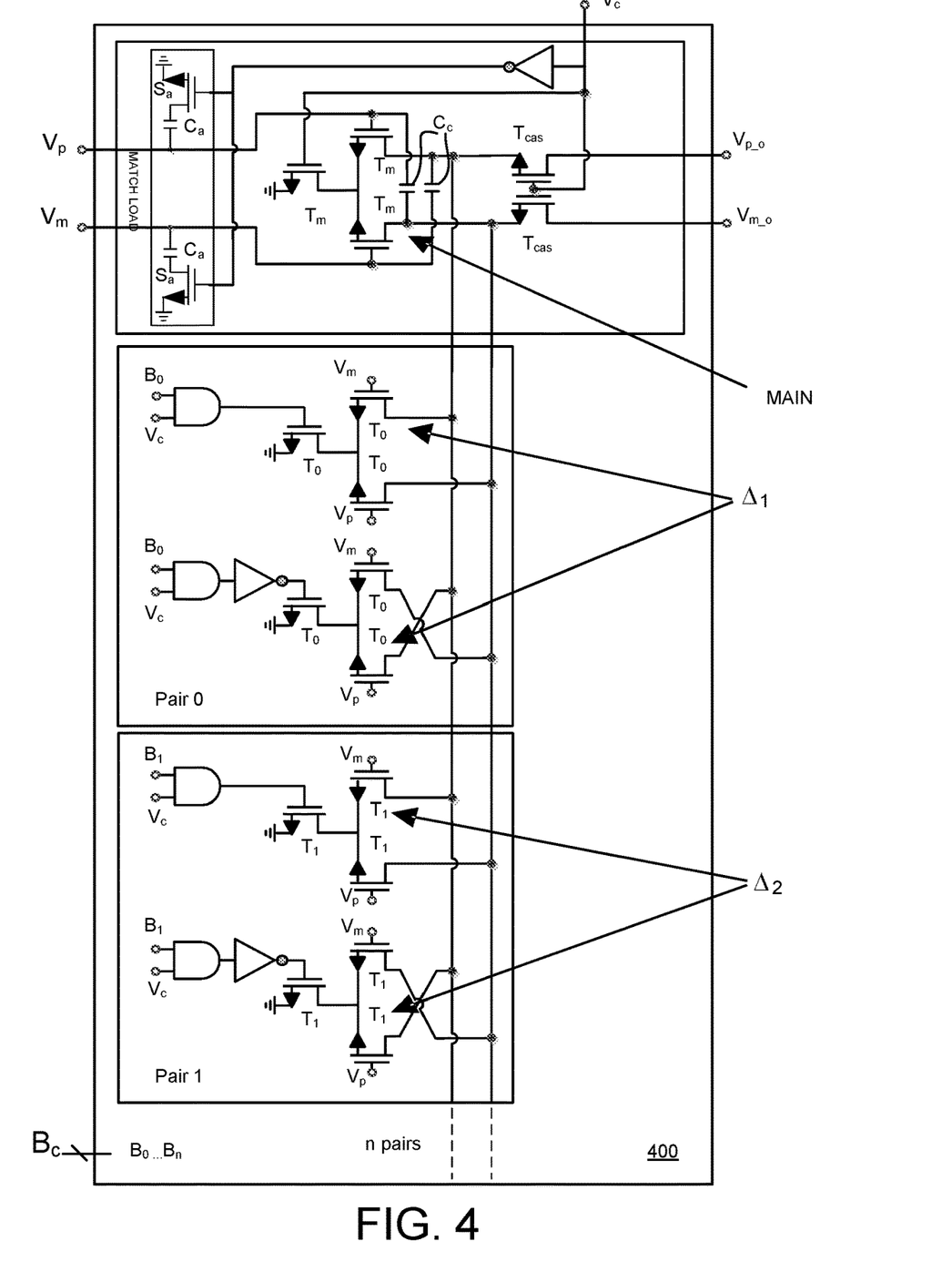
FIG. 4 is a simplified circuit diagram of a variable gain amplifier (VGA) having multiple gain steps and phase invariant design.

FIG. 4 is a simplified circuit diagram of a variable gain amplifier (VGA) 400 having multiple gain steps and phase invariant design. VGA 400 have a main gain stage and multiple incremental or decremental gain steps $\Delta_1, \Delta_2 \ldots \Delta_n$. The main gain stage comprises a cascode amplifier similar to cascode amplifier 200 in FIG. 2, including the main differential transistor pair $T_m$. Within each gain step $\Delta_n$, there are two sets of differential transistor pairs with opposite output connection, e.g., two $T_0$ pairs for $\Delta_1$ and two $T_1$ pairs for $\Delta_2$. The two diff transistor pairs contain a positive transconductance amplifier and a negative transconductance amplifier. Only one of the two diff transistor pairs are turned on at a time, which either add $\Delta_n/2*Gm$ or subtract $\Delta_n/2*Gm$, respectively, from the output Gm of the main differential transistor pair, depending which one of the diff pair is complementary turned on or off under the control signal $B_0, B_1 \ldots B_n$. Where Gm is the main differential transistor pair $T_m$'s transconductance. As a result, each gain step $\Delta_n$ can achieve a gain increment or a gain decrement step of $\Delta_n/2*Gm$ or $-\Delta_n/2*Gm$. The overall VGA gain is $\Sigma_{n=1}^{k}(Gm*(1\pm\Delta n/2))$.

There can be multiple (n) sets of gain step adjustment differential transistor pairs $(T_0, T_1, \ldots T_{n-1})$ for realizing the multiple gain steps. Maximum gain level is created when all negative transconductance in transistor pairs are turned off. The second peak gain level is created when only one negative transconductance in transistor pairs is turned on. The third peak gain level is created when only two negative transconductance in transistor pairs are turn on, and so on so forth. The transconductance of differential transistor pair is proportional to the transistor size, the transconductance ratio (size of transistor $T_0$ to $T_{n-1}$) thus can be designed to create desired gain steps in dB. Furthermore, such VGA has Phase Invariant Design. No matter what the gain step setting $(\Delta_n/2*Gm$ or $-\Delta_n/2*Gm)$ is, the input parasitic is always the same (two identical size diff transistor pair, one is on and one is off). Hence, the signal phase does not change regardless of the gain step is positive or negative. It is called phase-invariant variable gain amplifier.

Figure 5:
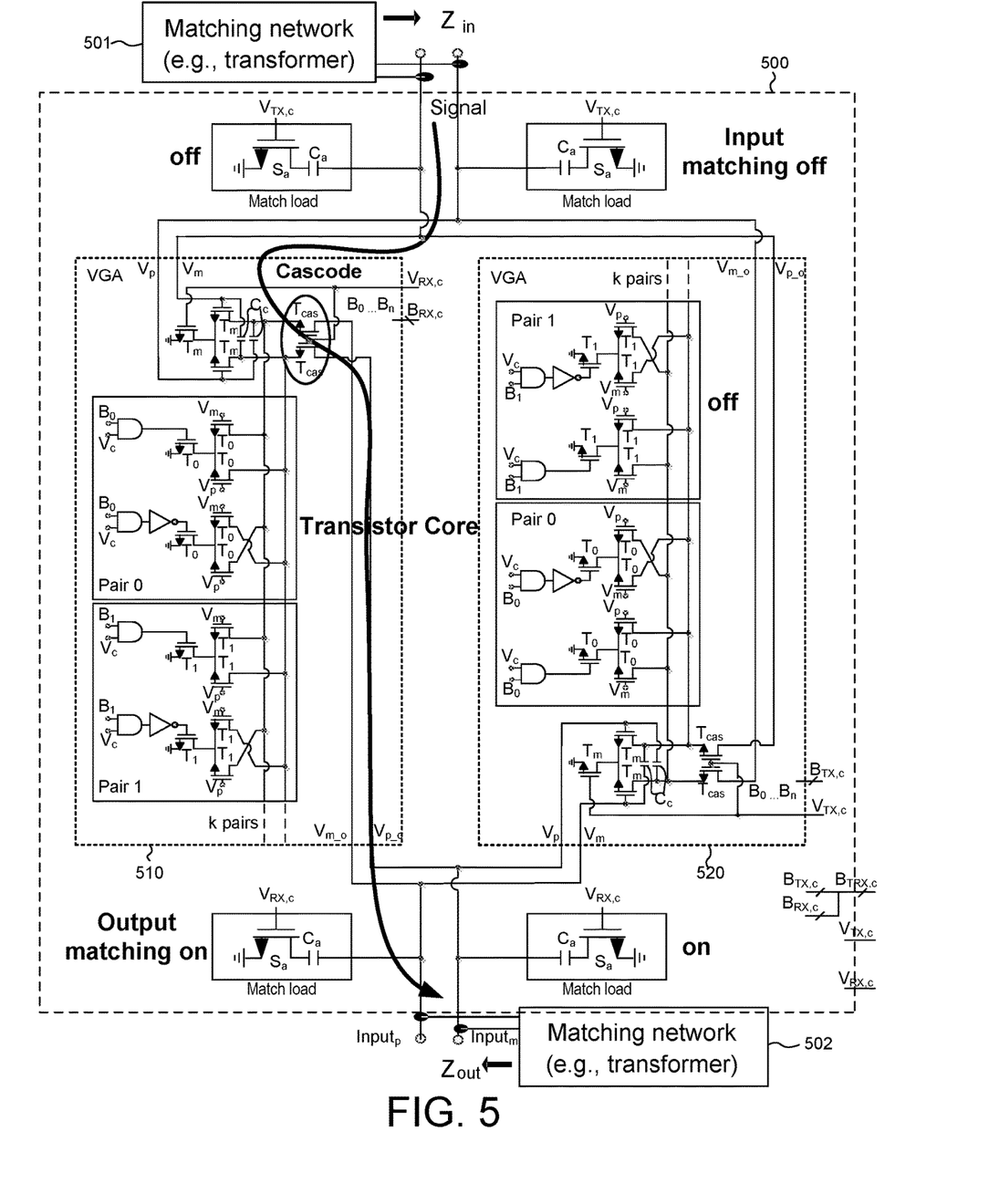
FIG. 5 is a simplified circuit diagram of a bi-directional VGA (BD_VGA) with signal flowing in a first direction.

FIG. 5 is a simplified circuit diagram of a bi-directional VGA (BD_VGA) 500 with signal flowing in a first direction. A bi-directional VGA can be formed by using a pair of high isolation amplifiers. In order to achieve bi-directional matching, the key to one of the preferred embodiments is to make input and output reactance (looking into the cascode transistor stacks) of the dual and interconnected complementary cascode transistor pair (one for each amplifier direction) unchanged when amplifier direction is switched. Note that only one cascode transistor stack is turned on at a time. The match load is attached to the cascode transistor stack in FIG. 5 to make the transistor reactance (capacitance) looks the same when one of the cascode transistor stack is switched off as when the cascode transistor stack is switched on. The match load comprises a switch and a matching capacitor $C_a$. The switch in the match load switches on and off to connect or disconnect the capacitor $C_a$, to create the same parasitic when the amplifier changes direction. Thus, the amplifier is matched in either amplifier direction, and the same input matching network and output matching network can be used for both amplifier directions. When the matching network (e.g., transformer to matching I/O to 50 ohm) is attached to both sides, the BD_VGA is realized.

In an alternative embodiment, the Transistor Core does not have the switched match load, thus, would have different input and output impedances, depending on the direction of the amplifier. The match load in the MN1 or MN2, are in different states (e.g., the switch in the match load for MN1 is on and the switch for MN2 is off or vice versa), presenting different MN1 impedance and MN2 impedance, to match to the Transistor Core. When the amplifier direction changes, the state of the two match loads change and the impedance of MN1 and MN2 changes accordingly to match to the Transistor Core impedance in the second amplifier direction.

In the embodiment of FIG. 5, BD_VGA 500 is formed by using a pair of high isolation amplifiers, left cascode amplifier 510 and right cascode amplifier 520. The input signal comes in from the top matching network 501. The top match load for input matching is turned off, signal goes through the left cascode amplifier 510, through the bottom match load for output matching, and then reach the bottom matching network 502. Note that when output match load is on and input match load is off, $\text{imag}(Z_{out}) \approx \text{imag}(Z_{in})$ if this is a single BD_VGA. BD_VGA 500 has the following features: 1) cascode transistor pairs; 2) high isolation with neutralization; 3) identical input and output reactance; 4) complementary gain control; and 5) orthogonality of amplitude and phase adjustment.

Figure 6:
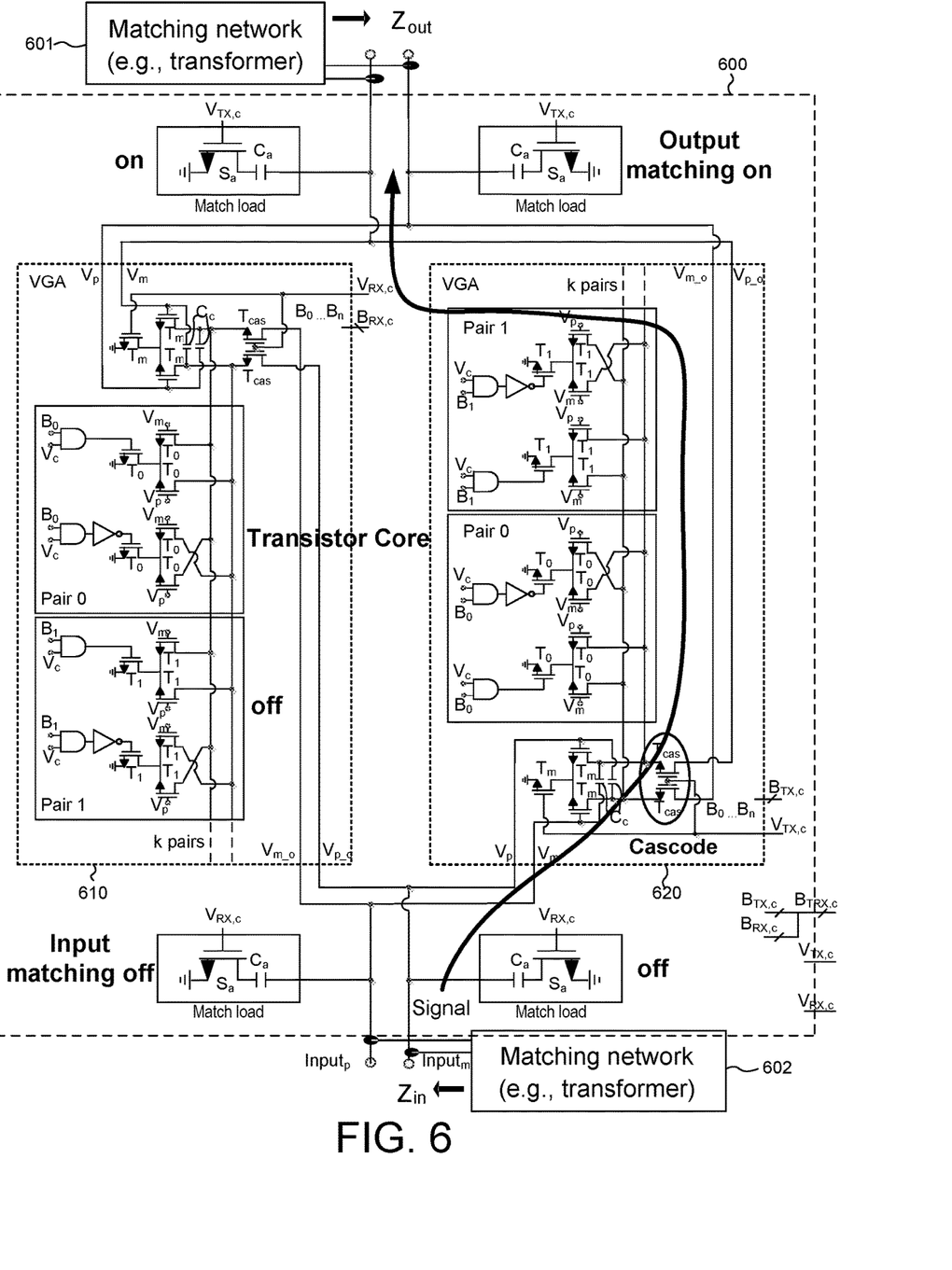
FIG. 6 is a simplified circuit diagram of a bi-directional VGA (BD_VGA) with signal flowing in a second direction.

FIG. 6 is a simplified circuit diagram of a bi-directional VGA (BD_VGA) 600 with signal flowing in a second direction. BD_VGA 600 is identical to BD_VGA 500 of FIG. 5, but with an opposite signal direction. In the embodiment of FIG. 6, BD_VGA 600 is formed by using a pair of high isolation amplifiers, left cascode amplifier 610 and right cascode amplifier 620. The input signal comes in from the bottom matching network 602. The bottom match load for input matching is turned off, signal goes through the right cascode amplifier 620, through the top match load for output matching, and then reach the top matching network 602. Note that when output match load is on and input match load is off, $\text{imag}(Z_{out}) \approx \text{imag}(Z_{in})$ if this is a single BD_VGA. BD_VGA 600 has the following features: 1) cascode transistor pairs; 2) high isolation with neutralization; 3) identical input and output reactance; 4) complementary gain control; and 5) orthogonality of amplitude and phase adjustment.

Figure 7:
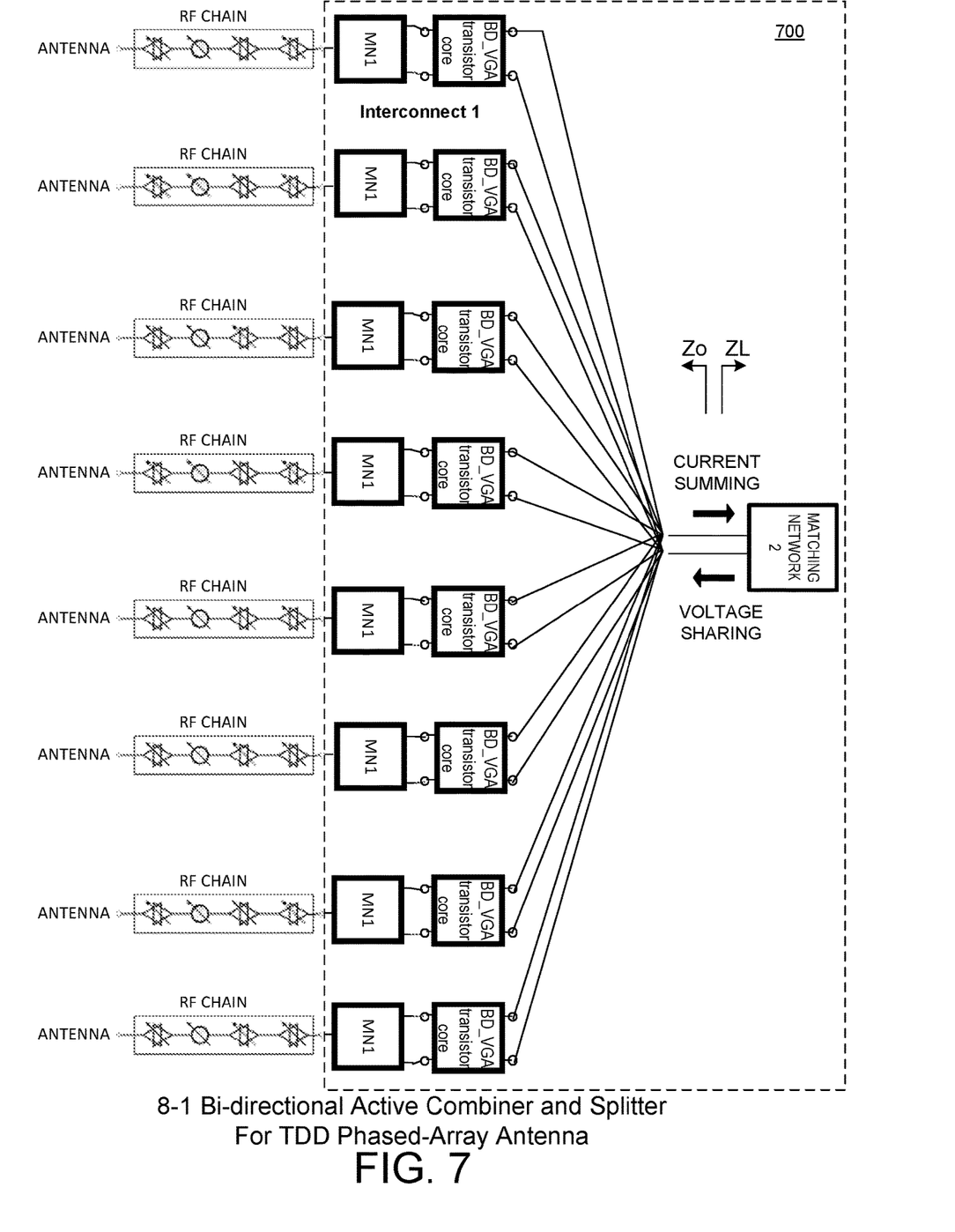
FIG. 7 illustrates a bi-directional active combiner and splitter for TDD phased-array antenna in beamformed wireless communication networks in accordance with a novel aspect.

FIG. 7 illustrates a bi-directional active combiner and splitter 700 for TDD phased-array antenna in beamformed wireless communication networks in accordance with a novel aspect. Time-Division Duplexing (TDD) Phased-Array Antenna comprises a plurality of antenna elements, a plurality of radio frequency (RF) chains with variable phase and amplitude, and an eight-to-one (8-1) bi-directional active combiner and splitter 700. The 8-1 bi-directional active combiner and splitter 700 comprises eight matching network 1 (MN1), eight bi-directional variable gain amplifier (BD_VGA) transistor core, and one matching network 2 (MN2). In the receiving direction, radio signals are received through the antenna elements, through the RF chains, and are then combined by combiner 700 for processing. MN1 are the input matching networks while MN2 is the output matching network. Similarly, in the transmitting direction, the splitter 700 takes an input signal and divides to a plurality of output signals, which are transmitted through the RF chains, and then transmitted out via the antenna elements. In this direction, MN2 is the input matching network while MN1 are the output matching networks. Depending on the amplifier direction, active combining or dividing is achieved with current summing (current combining) at output direction, or voltage sharing (current splitting) at input direction. Output matching is designed to have Zo=ZL* (conjugate matching) so that maximum power transfer can be achieved, where Zo is the impedance looking into combined BD_VGA side, and ZL is the impedance looking into MN 2. Further, the same MN1 and MN2 works for both BD_VGA directions.

The Transistor Core of BD_VGA 500 or 600 illustrated in FIGS. 5 and 6 can be used as the Transistor Core in the bi-directional active combiner and splitter 700. Advantages of the proposed bi-directional active combiner and splitter includes the following 1) compact size—for each BD_VGA, the cascode transistor pair is small and the same matching network MN2 is used by the cascode transistor pair; 2) high efficiency—no switching loss, only switched matching; 3) reduced passive trace loss and power consumption—simplified signal interconnection; 4) active current combining—eliminates large size in the passive combiner; 5) high input-output isolation—cascode and neutralization; 6) precise gain control and unequal combining or splitting—changing the gain of the BD_VGA; and 7) phase-invariant amplifier design.

Figure 8:
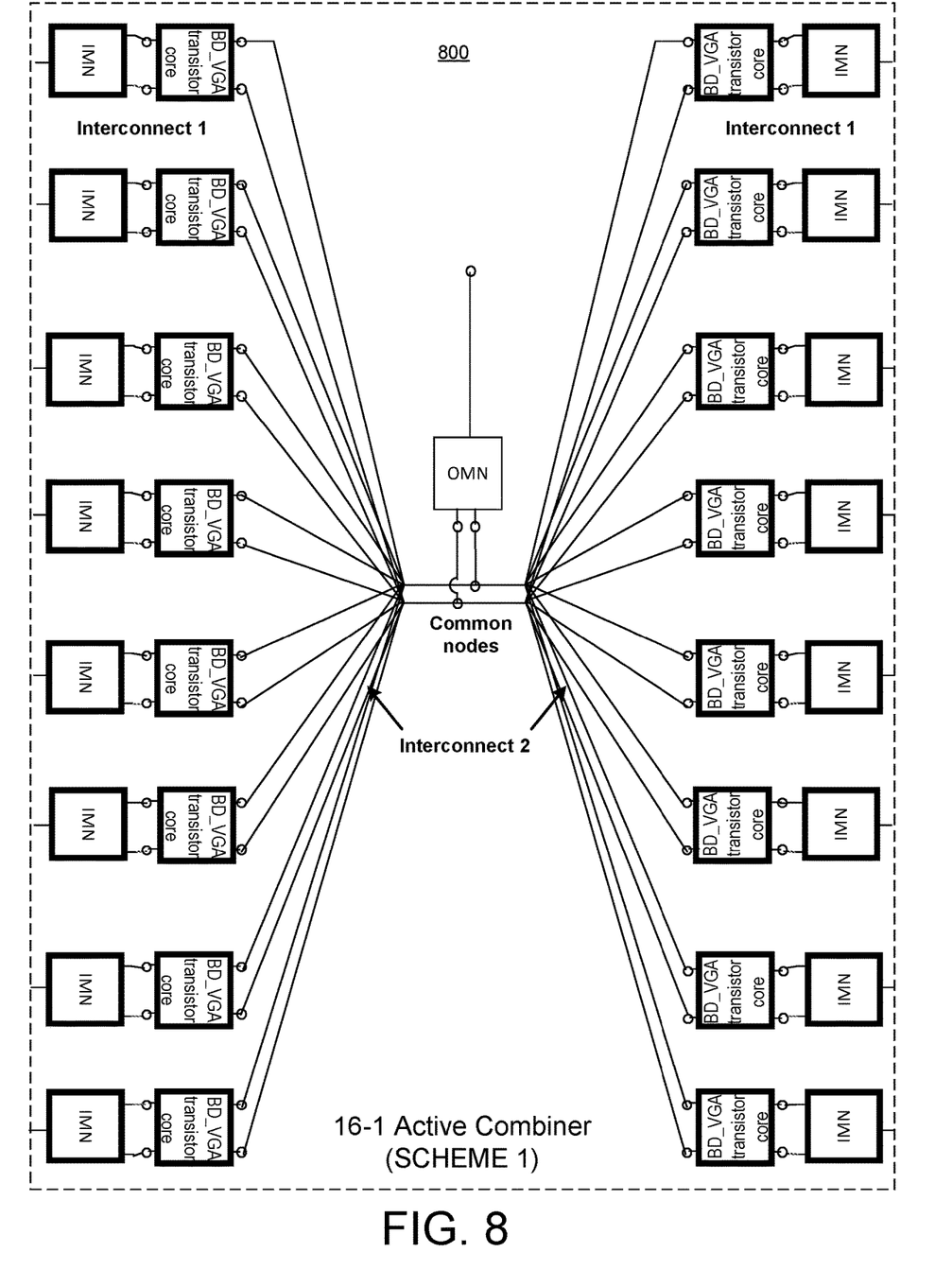
FIG. 8 illustrates a first embodiment of a 16-1 active combiner using bi-directional variable gain amplifier (BD_VGA) and shared matching network in accordance with one novel aspect.

FIG. 8 illustrates a first embodiment of a 16-1 active combiner 800 using bi-directional variable gain amplifier (BD_VGA) and shared matching network in accordance with one novel aspect. The 16-1 bi-directional active combiner 800 comprises 16 input matching networks (IMN), 16 bi-directional variable gain amplifiers (BD_VGA) transistor cores, and one output matching network (OMN). In the receiving direction, radio signals are received through antenna elements, through RF chains, and are then combined by combiner 800 for processing. Active combining is achieved with current summing (combining) at output direction. The 16-1 active combiner has 16 BD_VGAs. All BD_VGA transistor cores share one output matching network OMN. There are two interconnects: interconnect 1 connects each input matching network IMN to each DB_VGA transistor core, interconnect 2 connects each BD_VGA transistor core output together first, and then send to the output matching network OMN. In the embodiment of FIG. 8, the implementation is hard to realize when the n:1 active combiner has a high n. This is due to long traces connecting the BD_VGA outputs and OMN are quite long, which affect the current combining.

Figure 9:
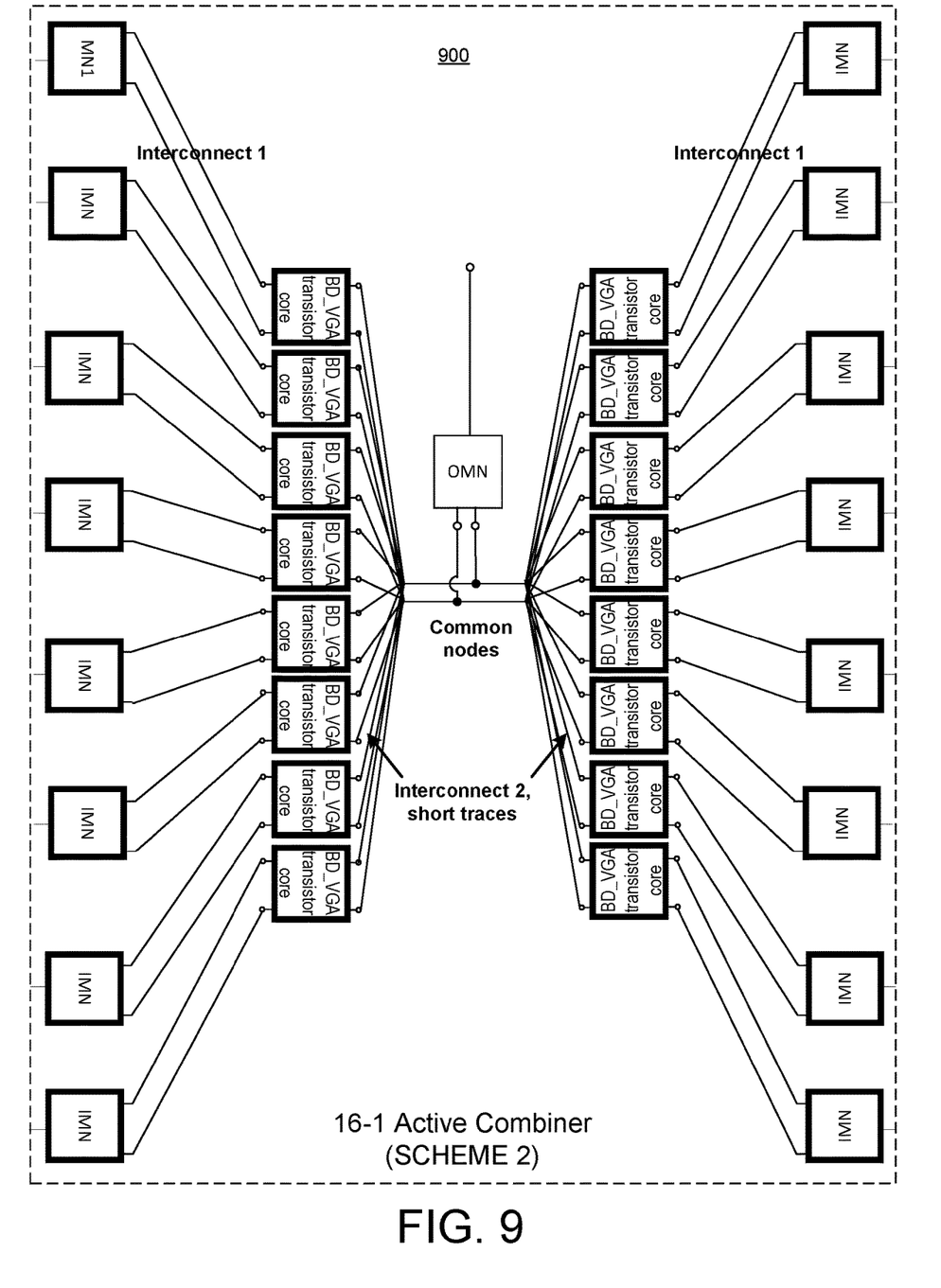
FIG. 9 illustrates a second embodiment of a 16-1 active combiner using bi-directional variable gain amplifier (BD_VGA) and shared matching network in accordance with one novel aspect.

FIG. 9 illustrates a second embodiment of a 16-1 active combiner 900 using bi-directional variable gain amplifier (BD_VGA) and shared matching network in accordance with one novel aspect. The 16-1 bi-directional active combiner 900 comprises 16 input matching networks (IMN), 16 bi-directional variable gain amplifiers (BD_VGA) transistor cores, and one output matching network (OMN). In the receiving direction, radio signals are received through the antenna elements, through the RF chains, and are then combined by combiner 900 for processing. Active combining is achieved with current summing (combining) at output direction. The 16-1 active combiner has 16 BD_VGAs. All BD_VGA transistor cores share one output matching network OMN. There are two interconnects: interconnect 1 connects each input matching network IMN to each DB_VGA transistor core, interconnect 2 connects each BD_VGA transistor core together first, and then send to the output matching network OMN. In the embodiment of FIG. 9, the interconnect 2 transmission line (short traces) could be nearly zero length (low loss) by the fact that the active combiner adopts current combining topology. Accordingly, the active combiner layout can be arranged such that all BD_VGAs are as close as possible to achieve very compact combiner layout. The length of interconnect 1 transmission line is equal to each other, and is considered as an additional matching component.

Figure 10:
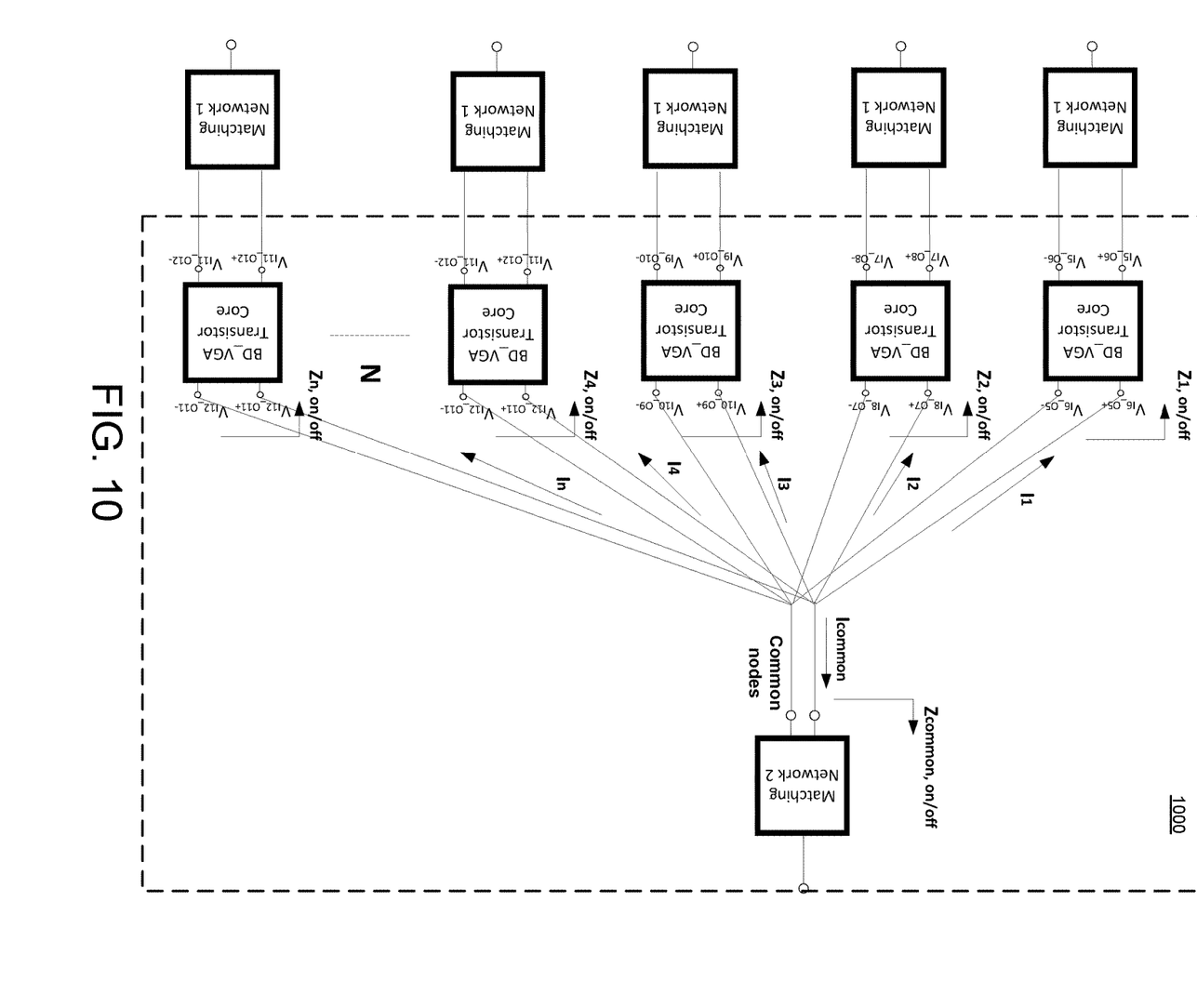
FIG. 10 illustrates a third embodiment of an active combiner/splitter using bi-directional variable gain amplifier (BD_VGA) and shared matching network in accordance with one novel aspect.

FIG. 10 illustrates a third embodiment of an active combiner/splitter 1000 using bi-directional variable gain amplifier (BD_VGA) and shared matching network in accordance with one novel aspect. In some scenario the number of the Transistor Cores may need to be adjusted, meaning turn-off some of them or disconnect some antenna elements in arrays. Active combiner/splitter 1000 shows such situation, where the goal is to minimize the signal power, $P_i$, i=0, 1, 2 . . . n flow into the into the Transistor Cores which are off, while maximize the signal power flow into common node load impedance, $Z_{common}$. Consequently, two conditions should be met to accomplish the proposed active combining/dividing technique. First, the off-state impedance of Transistor Core should be significantly higher than the on-state Transistor Core, i.e. $Z_{j,off} \gg Z_{i,on}$ for i=0, 1, 2 . . . n, i≠j. Second, the off-state impedance of Transistor Core should be significantly higher than the common node load impedance, i.e. $Z_{j,off} \gg Z_{common}$. The preferred embodiment of Transistor Core to realize high impedance in the off state is to use cascode topology, long channel length, or small channel width, for the Transistor Core to achieve higher impedance for the off state. The preferred embodiment of MN2 for the common node is a transformer or a common gate transistor that transfer low impedance $Z_{common}$ to a higher impedance.

Although the present invention has been described in connection with certain specific embodiments for instructional purposes, the present invention is not limited thereto. Accordingly, various modifications, adaptations, and combinations of various features of the described embodiments can be practiced without departing from the scope of the invention as set forth in the claims.

What is claimed is:

1. A bi-directional active combiner and splitter, comprises:
   a plurality of first matching networks (MN1s), each MN1 coupled to a first I/O signal terminal;
   a plurality of bi-directional variable gain complementary transistor cores (Transistor Cores) coupled to a corresponding MN1, wherein each Transistor Core is formed by a pair of high isolation cascode amplifiers, and are connected with each other to a common node; and
   a shared second matching network (MN2) coupled to the common node of the plurality of Transistor Cores and a second I/O signal terminal, wherein the plurality of Transistor Cores shares the same MN2, and wherein the bi-directional active combiner and splitter have input reactance and output reactance that match to the plurality of Transistor Cores for both switched amplifier directions, respectively.

2. The combiner and splitter of claim 1, wherein output currents from the Transistor Cores are summed onto the common node, wherein the plurality of MN1s becomes a plurality of input matching networks, and wherein MN2 becomes an output matching network for the combiner.

3. The combiner and splitter of claim 1, wherein an input voltage on the common node is shared by the Transistor Cores, wherein the plurality of MN1s becomes a plurality of output matching networks, and wherein MN2 becomes an input matching network for the splitter.

4. The combiner and splitter of claim 1, wherein current summing or voltage sharing occurs the common node and thereby achieving active combining or splitting, for both switched amplifier directions without using passive structures.

5. The combiner and splitter of claim 1, wherein a first plurality of transmission lines interconnects between the plurality of MN1s and the plurality of Transistor Cores, wherein a second plurality of transmission lines interconnects the plurality of Transistor Cores and the common node.

6. The combiner and splitter of claim 5, wherein the first plurality of transmission lines is extended such that the plurality of Transistor Cores is arranged to be close to each other to achieve a compact layout.

7. The combiner and splitter of claim 1, wherein the plurality of Transistor Cores comprises match loads with switched matching to achieve identical input and output reactance in both switched amplifier directions.

8. The combiner and splitter of claim 1, wherein the plurality of MN1s and MN2 comprise match loads with switched matching to achieve identical reactance in both switched amplifier directions.

9. The combiner and splitter of claim 1, wherein each Transistor Core is phase-invariant and having variable gain with multiple gain steps.

10. The combiner and splitter of claim 1, wherein each Transistor Core comprises a cascode transistor pair to provide input and output isolation.

11. The combiner and splitter of claim 1, wherein each Transistor Core further comprises neutralization capacitors to compensate capacitive coupling.

12. The combiner and splitter of claim 1, wherein a subset of the plurality of Transistor Cores is switched off while maintaining impedance matching.

13. The combiner and splitter of claim 12, wherein the cascode amplifiers allow a high off impedance while MN2 allows low common node impedance.

14. A bi-directional variable gain amplifier (BD_VGA), comprising:
   a first matching network (MN1) coupled to a first I/O signal terminal;
   a second matching network (MN2) coupled to a second I/O signal terminal;
   a Transistor Core coupled to the first and the second I/O signal terminals, wherein the Transistor Core comprises a pair of high-isolation amplifiers including a first amplifier and a second amplifier, and each amplifier comprises:
      a pair of cascode transistors; and
      a pair of differential transistors that provides a main gain level, wherein inputs of the pair of differential transistors of the first amplifier is coupled to outputs of the pair of differential transistors of the second amplifier, and outputs of the pair of differential transistors of the first amplifier is coupled to inputs of the pair of differential transistors of the second amplifier, wherein a reactance of MN1 and MN2 match to the Transistor Core for both amplifier directions, respectively.

15. The BD_VGA of claim 14, wherein a digital control signal controls such that only one of the differential transistor pairs is turned on for one of the amplifier directions.

16. The BD_VGA of claim 14, wherein the Transistor Core comprises switched match loads to provide reactance matching such that the BD_VGA has near identical input and output matching reactance for both amplifier directions.

17. The BD_VGA of claim 16, wherein each switched match load comprises a capacitor and a transistor acting as a switch controlled by a digital control signal, wherein the switch is turned on if the corresponding amplifier is turned off and the switch is turned off of the corresponding amplifier is turned on.

18. The BD_VGA of claim 14, wherein MN1 and MN2 each comprises a switched match load to provide reactance matching such that the BD_VGA has near identical input and output matching reactance for both amplifier directions.

19. The BD_VGA of claim 18, wherein the switched match load comprises a capacitor and a transistor acting as a switch controlled by a digital control signal, wherein the switch is turned on if the corresponding amplifier is turned off and the switch is turned off of the corresponding amplifier is turned on.

20. The BD_VGA of claim 14, wherein the first and the second amplifiers are variable gain amplifiers having multiple gain steps.

21. The BD_VGA of claim 20, wherein each gain step further comprises two differential transistor pairs with opposite output connection, wherein only one of the pairs is turned on at a time.

22. The BD_VGA of claim 21, wherein each gain step can achieve a gain increment step of $\Delta n/2*Gm$ or a gain decrement step of $-\Delta n/2*Gm$.

23. The BD_VGA of claim 22, wherein an input signal phase does not change regardless of the gain step is increment or decrement.

24. The BD_VGA of claim 14, wherein each cascode transistor pair is coupled to an output of the corresponding amplifier to provide input and output isolation.

25. The BD_VGA of claim 14, wherein Transistor Core further comprises neutralization capacitors to compensate capacitive coupling.

* * * * *